United States Patent
Huang et al.

(10) Patent No.: US 8,437,166 B1
(45) Date of Patent: May 7, 2013

(54) WORD LINE DRIVER CELL LAYOUT FOR SRAM AND OTHER SEMICONDUCTOR DEVICES

(75) Inventors: Shu Cheng Huang, Taipei (TW); Hsin-Hsin Ko, Hsinchu (TW); Jung-Hsuan Chen, Hsinchu (TW); Chiting Cheng, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/297,296

(22) Filed: Nov. 16, 2011

(51) Int. Cl.
*G11C 5/06* (2006.01)
(52) U.S. Cl.
USPC ............... 365/72; 365/51; 365/63; 365/154
(58) Field of Classification Search .............. 365/72, 365/63, 51, 154
See application file for complete search history.

(56) References Cited

U.S. PATENT DOCUMENTS

| | | | | |
|---|---|---|---|---|
| 6,501,672 B1* | 12/2002 | Sekiguchi et al. | ............... | 365/72 |
| 7,033,883 B2* | 4/2006 | Huang et al. | ............... | 438/238 |
| 7,161,823 B2* | 1/2007 | Lee et al. | ............... | 365/63 |
| 7,219,324 B1* | 5/2007 | Sherlekar et al. | ............. | 257/207 |
| 7,240,314 B1* | 7/2007 | Leung | ............. | 257/773 |
| 7,436,078 B2* | 10/2008 | Yang et al. | ............... | 365/51 |
| 7,501,689 B2* | 3/2009 | Yoshida et al. | ............... | 257/502 |
| 7,593,252 B2* | 9/2009 | Katsuki et al. | ............... | 365/154 |
| 7,808,804 B2* | 10/2010 | Kwon | ............. | 365/51 |
| 7,821,038 B2* | 10/2010 | Ko et al. | ............. | 257/207 |
| 8,132,142 B2* | 3/2012 | Sherlekar et al. | ............. | 716/127 |
| 2009/0193381 A1* | 7/2009 | Chuang | ............. | 716/12 |
| 2011/0113398 A1* | 5/2011 | Keinert et al. | ............. | 716/127 |

* cited by examiner

*Primary Examiner* — Viet Q Nguyen
(74) *Attorney, Agent, or Firm* — Duane Morris LLP

(57) ABSTRACT

A word line driver cell suitable for RAM devices such as SRAM, static random access memory devices, is provided. The word line driver cell is compatible with double pattern processing techniques and enables the formation of all word lines from a single metal layer which, in turn, enables overlying and underlying metal levels to be used for other features such as signal lines for word line decoders. A power mesh is formed using multiple metal layers and the formation of all the word lines from a single metal layer enables VDD and VSS power lines that are formed from an overlying layer to extend orthogonal to the cell direction and include wider widths reducing metal line resistance and increasing the deliverable power.

20 Claims, 1 Drawing Sheet

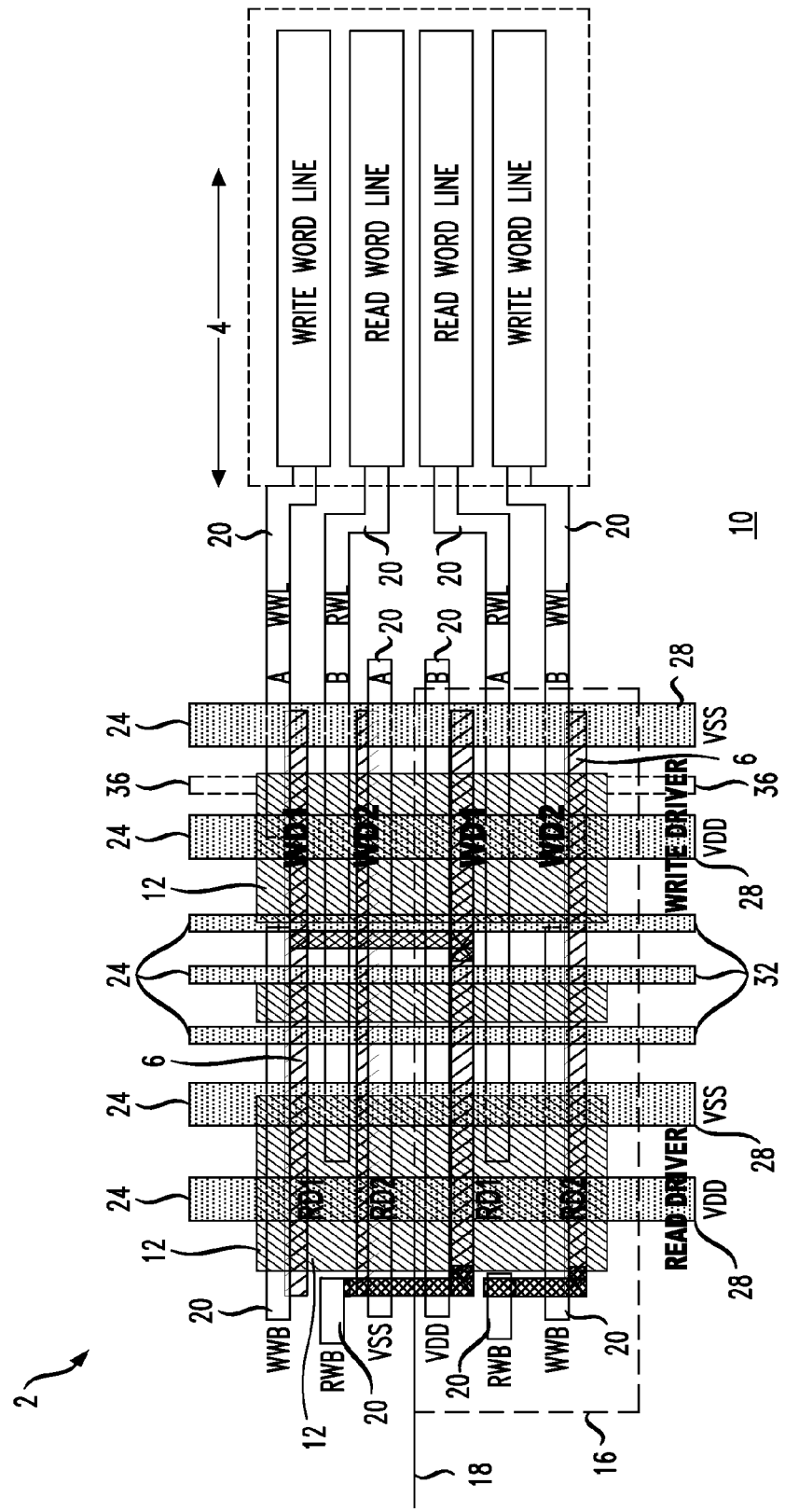

WORD LINE DRIVER CELL LAYOUT FOR SRAM AND OTHER SEMICONDUCTOR DEVICES

TECHNICAL FIELD

The disclosure is directed to a highly integrated layout scheme for device cells in word line decoder devices or other semiconductor devices.

BACKGROUND

Memory devices such as, for example, semiconductor random access memory (RAM) circuits store logic states by applying either high or low voltage levels to memory cell transistors that form a memory cell array. A static random access memory ("SRAM") array is basically constructed of memory cells as storage units arranged at the intersections of a plurality of word lines arranged in the row direction and a plurality of bit lines arranged in the column direction. In a "read" operation, a read voltage is applied to the gate of the memory cell, and the corresponding indication of whether the memory cell turns on (e.g., conducts current) indicates the programming state of the memory cell, e.g. a memory cell that conducts current during the "read" operation may be assigned a digital value of "1," and a memory cell that does not conduct current during the "read" operation may be assigned a digital value of "0".

In order to control the application of voltage to the gate lines of selected cells in a memory cell array, gate line, i.e. word line voltage control circuits are typically employed. In general, memory cells are accessible by applying activation voltages to word lines and bit lines (drain lines). In this regard, word lines are typically used to activate memory cells and bit lines to provide data to or retrieve data from activated memory cells. In a word line voltage control circuit, high and low (or negative) voltage levels may be applied to selected word lines of a memory cell array by a decoder circuit (e.g., a word line driver) in order to activate selected memory cells. In other words, when memory access is desired, an activation voltage may be applied to the corresponding word line by the word line driver to perform the desired function (e.g., read or write). In some cases, when memory access is not needed, the word line driver may apply a deactivation voltage to cease memory access function. The word line driver circuit/cell is therefore one of the most crucial circuits in a memory array.

Various word line driver cell designs have been used. Current designs often require relatively large area footprints due to the inclusion of a large number of transistors, however. Conventional word line drivers therefore often take up a relatively large area.

Word line driver cells may include multiple levels of metal interconnect layers. Transistors formed in the word line driver cells typically have polysilicon gates and may be longitudinally spaced. The word lines are generally metallic and connect the gates of transistors of a certain row in the array. Because of various design rules and limitations in the photographic processes available, one shortcoming of current methods and design layouts is that multiple layers of metallization must be utilized for the word lines because of various design rules and limitations in the photographic processes available. This limits the availability of multiple metal layers from being used for other purposes. Another shortcoming is that word line driver cells take up a large area at the expense of other device features at a time when there is a push to increase levels of integration and fit more components into a smaller area.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1 is an embodiment of a layout for a word line driver cell according to the disclosure.

DETAILED DESCRIPTION

The disclosure provides a word line driver cell layout compatible with double pattern lithography, DPL, and in which all write word lines and all read word lines can be formed of a single metal layer. This enables an overlying metal layer or layers to be used for other purposes and therefore increases integration levels of the cell. The word line driver cell may advantageously be included as part of a repeating group of cells that are aligned end to end along word lines and may be utilized in RAM, random access memory devices such as SRAM, static random access memory devices or in SRAM portions of other integrated circuit or other semiconductor devices.

FIG. 1 shows exemplary word line driver cell 2 that extends lengthwise along longitudinal polysilicon direction 4. Polysilicon leads 6 are shown to extend longitudinally along word line driver cell 2, and in particular along longitudinal polysilicon direction 4. Polysilicon leads 6 are formed over semiconductor substrate 10 which may be a silicon substrate or formed of other suitable semiconductor materials. Active areas 12 are formed within a surface of semiconductor substrate 10. Polysilicon leads 6 are formed over active area 12 and form the gates of multiple transistors formed within word line driver cell 2 and coupled by the word lines. Active areas 12 are divided into two sections: a PMOS portion identified by dashed line 16 and an NMOS portion being portions of active area 12 other than the PMOS portion. It can be seen that dividing line 18 that divides the PMOS portions from NMOS portions extends longitudinally along longitudinal polysilicon direction 4, the PMOS and NMOS portions being disposed on opposed sides of dividing line 18.

The read driver and write driver portions of the word line driver cell layout are as identified in FIG. 1. The read driver including RD1 and RD2 drives the read word lines RWL and RWB and the write driver including WD1 and WD2 drives the write word lines WWL and WWB, each by applying appropriate activation or deactivation voltages.

Metal lines 20 are each formed of the same metal layer which may be an intermediate metal layer in one exemplary embodiment. Metal lines 20 may be formed of copper, aluminum, their alloys or various other suitable metal materials. Metal lines 20 include all of the word lines of word line driver cell 2. More particularly, metal lines 20 include all of the write word lines and all of the read word lines utilized in the disclosed word line driver cell 2. In other words, additional metal layers are not needed for the read word lines or write word lines. Write word lines are further identified by the designation "WWL" and the inverted write word lines identified by the designation "WWB". Read word lines are identified by the designation "RWL" and the inverted read word lines identified by the designation "RWB". Although there are four (4) total word lines in the illustrated embodiment, this is exemplary only. Metal lines 20, all formed from the same intermediate metal layer, also include power lines designated by "vss" and "vdd".

Metal lines 20 are further designated by "A" or "B". Metal lines 20 may advantageously be formed from a single metal layer using double patterning lithography, DPL, and the A designation identifies metal leads 20 formed by one photomask whereas the B designation identifies metal leads 20 formed by another photomask. It can be thereby appreciated that alternate metal lines 20 are formed by different photomasks. In other exemplary embodiments, all metal lines 20 may be formed using a single photo-patterning operation.

Metal lines 24 are each formed from the same upper metal layer that is disposed over the intermediate metal layer from which metal lines 20 are formed. Each metal line 24 extends orthogonally with respect to longitudinal polysilicon direction 4. Metal lines 24 include power lines 28 also identified by VDD or VSS and also signal lines 32 that may provide signals to a word line decoder. It can be seen that power lines 28 are wider than signal lines 32 and also that power lines 28 are wider than the power lines vss and vdd formed of metal lines 20. The combined power lines form an orthogonal power mesh bus arrangement that includes upper power lines 28 and lower power lines designated as vss and vdd metal lines 20. According to various exemplary embodiments, metal lines 24 may be formed from a third metal layer with metal lines 20 formed from a second metal layer and the power mesh may include additional power lines formed from a subjacent first metal layer and which extend along a direction orthogonal to longitudinal polysilicon direction 4. Dashed line 36 indicates the general orientation that such a subjacent power line may take. The arbitrary designation of "first", "second" and "third" metal layers is simply to illustrate three different metal levels and is exemplary only. The meshed power system advantageously supplies adequate power throughout the integrated circuit or other semiconductor device chip and eliminates the impact of increased metal layer resistance, an important design challenge in most semiconductor designs, including designs for random access memory (RAM) devices, especially as the number of transistors included in a chip becomes larger and the design rule parameters therefore become smaller. The meshed power system is advantageously suited for array-type integrated circuits such as RAM and SRA devices. The power mesh system includes multiple metal layers, each electrically isolated from each other, and may advantageously include a positive supply voltage (VDD) mesh and a negative supply voltage (VSS) mesh, for VDD power buses and VSS power buses, respectively.

It should be noted that the upper metal layer of the illustrated embodiment that includes metal lines 24, is free to be used for power lines and for word line predecoder signal lines and is not needed for read word lines and write word lines which are each formed completely from metal leads 20 of the intermediate metal layer. Further, since the word lines are all formed from metal leads 20 of the intermediate metal layer and since the upper metal layer is not needed to form word lines, the VDD and VSS power lines 28 are formed to include greater widths than the VDD and VSS power lines formed of metal lines 20. VDD and VSS power lines 28 therefore include a reduced metal line resistance and are capable of delivering greater power.

According to one aspect, a word line driver cell in an SRAM (static random access memory) device is provided. The word line driver cell comprises polysilicon leads that extend along a longitudinal cell direction; a plurality of metal lines of a single metal layer comprising all read word lines of the cell and all write word lines of the cell and extending along the longitudinal cell direction; and a plurality of further metal lines of a further metal layer disposed over the single metal layer and extending orthogonally to the longitudinal cell direction, the plurality of further metal lines comprising power lines.

According to another aspect, a word line driver cell in a semiconductor memory device is provided. The word line driver cell comprises a plurality of polysilicon leads extending along a longitudinal direction; a plurality of metal lines of a single metal layer comprising all read word lines and all write word lines of the cell and extending along the longitudinal direction; and a power mesh arrangement comprising a plurality of power lines. The plurality of power lines include intermediate power lines formed of the single metal layer and extending along the longitudinal direction, upper power lines formed of a superjacent metal layer and extending orthogonal to the longitudinal direction and lower power lines formed of a subjacent metal layer and extending orthogonal to the longitudinal direction.

According to yet another aspect, a method for forming a semiconductor device including a word line driver cell is provided. The method comprises providing a semiconductor substrate; forming a plurality of polysilicon leads extending along a longitudinal cell direction of the word line driver cell; forming a plurality of metal lines from a single metal layer, the plurality of metal lines comprising all read word lines of the cell and all write word lines of the cell and at least two power lines, the forming a plurality of lines including patterning the single metal layer using two photomasks such that all adjacent lines of the plurality of lines are formed by different photomasks; and forming a plurality of further metal lines from a further metal layer over the single metal layer, the plurality of further metal lines extending orthogonal to the longitudinal cell direction and including further power lines.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A word line driver cell in an SRA (static random access memory) device comprising:
   polysilicon leads that extend along a longitudinal cell direction;
   a plurality of metal lines of a single metal layer comprising all read word lines of said cell and all write word lines of said cell and extending along said longitudinal cell direction; and
   a plurality of further metal lines of a further metal layer disposed over said single metal layer and extending orthogonally to said longitudinal cell direction, said plurality of further metal lines comprising power lines.

2. The word line driver cell as in claim 1, further comprising further power lines extending orthogonally to said longitudinal cell direction and disposed below said single metal layer.

3. The word line driver cell as in claim 2, further comprising intermediate power lines formed of said single metal layer and extending along said longitudinal cell direction, said power lines, said further power lines and said intermediate power lines forming a power mesh.

4. The word line driver cell as in claim 1, further comprising intermediate power lines formed of said single metal layer and extending along said longitudinal cell direction.

5. The word line driver cell as in claim 4, wherein said power lines are wider than said intermediate power lines.

6. The word line driver cell as in claim 1, wherein said power lines are wider than said read word lines and wider than said write word lines.

7. The word line driver cell as in claim 1, wherein said plurality of metal lines of a single metal layer include two read word lines and two write word lines.

8. The word line cell as in claim 1, wherein said word line driver cell is formed over a semiconductor substrate and further includes an NMOS active area section formed in said semiconductor substrate and a PMOS active area section formed in said semiconductor substrate, wherein each of said NMOS and PMOS active areas sections extend lengthwise along said longitudinal cell direction and are disposed on opposite sides of a dividing line that extends along said longitudinal cell direction.

9. The word line driver cell as in claim 1, wherein said plurality of further lines of a further metal layer disposed over said single metal layer further includes signal lines comprising a word line decoder, and said power lines are wider than said signal lines.

10. A word line driver cell in a semiconductor memory device, comprising:
    a plurality of polysilicon leads extending along a longitudinal direction;
    a plurality of metal lines of a single metal layer comprising all read word lines and all write word lines of said cell and extending along said longitudinal direction;
    a power mesh arrangement comprising a plurality of power lines, said plurality of power lines including intermediate power lines formed of said single metal layer and extending along said longitudinal direction, upper power lines formed of a superjacent metal layer and extending orthogonal to said longitudinal direction and lower power lines formed of a subjacent metal layer and extending orthogonal to said longitudinal direction.

11. The word line driver cell as in claim 10, wherein said word line driver cell is formed over a semiconductor substrate and further includes an NMOS active area section formed in said semiconductor substrate and a PMOS active area section formed in said semiconductor substrate wherein a dividing line that divides said NMOS active area section from said PMOS active area section extends along said longitudinal direction.

12. The word line driver cell as in claim 10, wherein said upper power lines include a width greater than a width of said intermediate power lines.

13. The word line driver cell as in claim 10, further comprising signal lines formed of said superjacent metal layer and extending orthogonal to said longitudinal direction and disposed between said upper power lines.

14. The word line driver cell as in claim 10, wherein said upper power lines include VOD power lines and VSS power lines.

15. The word line driver cell as in claim 10, wherein said semiconductor memory device comprises an SRAM (static random access memory) device.

16. A method for forming a semiconductor device including a word line driver cell, said method comprising:
    providing a semiconductor substrate;
    forming a plurality of polysilicon leads extending along a longitudinal cell direction of said word line driver cell;
    forming a plurality of metal lines from a single metal layer, said plurality of metal lines comprising all read word lines of said cell and all write word lines of said cell and at least two power lines, said forming a plurality of lines including patterning said single metal layer using two photomasks such that all adjacent lines of said plurality of lines are formed by different photomasks; and
    forming a plurality of further metal lines from a further metal layer over said single metal layer, said plurality of further metal lines extending orthogonal to said longitudinal cell direction and including further power lines.

17. The method as in claim 16, further comprising forming a PMOS active area section in said word line driver cell on one side of a dividing line that extends along said longitudinal cell direction and forming an NMOS active area section in said word line driver cell on the other side of said dividing line.

18. The method as in claim 16, further comprising coupling at least one said further power line to VSS and coupling at least one said further power line to VDD.

19. The method as in claim 16, further comprising forming a lower metal layer between said plurality of polysilicon leads and said single metal layer and forming at least one lower metal power line from said lower metal level and extending orthogonal to said longitudinal cell direction, wherein said lower metal power lines, said further power lines and said at least two power lines form a power mesh.

20. The method as in claim 16, wherein said forming a plurality of further metal lines includes said plurality of further metal lines further including pre-decoder signal lines.

* * * * *

UNITED STATES PATENT AND TRADEMARK OFFICE
CERTIFICATE OF CORRECTION

PATENT NO. : 8,437,166 B1
APPLICATION NO. : 13/297296
DATED : May 7, 2013
INVENTOR(S) : Shu Cheng Huang et al.

It is certified that error appears in the above-identified patent and that said Letters Patent is hereby corrected as shown below:

In the claims:

Claim 1, Column 5, Line 15, delete "SRA" and insert -- SRAM --.

Claim 14, Column 6, Line 26, delete "VOD" and insert -- VDD --.

Signed and Sealed this
Twelfth Day of November, 2013

Teresa Stanek Rea
*Deputy Director of the United States Patent and Trademark Office*